(12) United States Patent
Telenczak et al.

(10) Patent No.: US 11,777,500 B2
(45) Date of Patent: Oct. 3, 2023

(54) NBTI PROTECTION FOR DIFFERENTIAL PAIRS

(71) Applicant: TEXAS INSTRUMENTS INCORPORATED, Dallas, TX (US)

(72) Inventors: Damien Valentin Thibault Telenczak, Freising (DE); Mikhail Valeryevich Ivanov, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 29 days.

(21) Appl. No.: 17/969,778

(22) Filed: Oct. 20, 2022

(65) Prior Publication Data
US 2023/0155588 A1    May 18, 2023

Related U.S. Application Data

(63) Continuation of application No. 17/525,711, filed on Nov. 12, 2021, now Pat. No. 11,509,307.

(51) Int. Cl.
*H03K 19/003* (2006.01)
*H03K 19/173* (2006.01)
*H03K 19/0185* (2006.01)
*H03F 1/52* (2006.01)

(52) U.S. Cl.
CPC ....... *H03K 19/00384* (2013.01); *H03F 1/523* (2013.01); *H03K 19/0185* (2013.01); *H03K 19/1737* (2013.01)

(58) Field of Classification Search
CPC .......................... H03K 19/00384; H03F 1/523
USPC .......................................................... 327/100
See application file for complete search history.

(56) References Cited

U.S. PATENT DOCUMENTS

| | | | |
|---|---|---|---|
| 2011/0012642 A1* | 1/2011 | Whetsel | H03K 19/01759 326/82 |
| 2022/0016103 A1 | 5/2022 | Feldman | |
| 2022/0161033 A1* | 5/2022 | Feldman | A61N 1/05 |

\* cited by examiner

*Primary Examiner* — Tomi Skibinski
(74) *Attorney, Agent, or Firm* — Valerie M. Davis; Frank D. Cimino

(57) ABSTRACT

In examples, a system includes a differential input device having a first input and a second input. The system includes a window generator configured to output, at a first output, a first voltage above a reference voltage and a second voltage, at a second output, below the reference voltage. The system includes a multiplexer coupled to the first output and the second output, the multiplexer configured to receive the first voltage, the second voltage, and an input voltage. The system includes a selector coupled to the multiplexer and configured to select the first voltage, the second voltage, or the input voltage based on a value of the input voltage, where the selector is configured to cause the multiplexer to provide the selected voltage to the first input of the differential input device, where a voltage source provides the reference voltage to the second input of the differential input device.

17 Claims, 4 Drawing Sheets

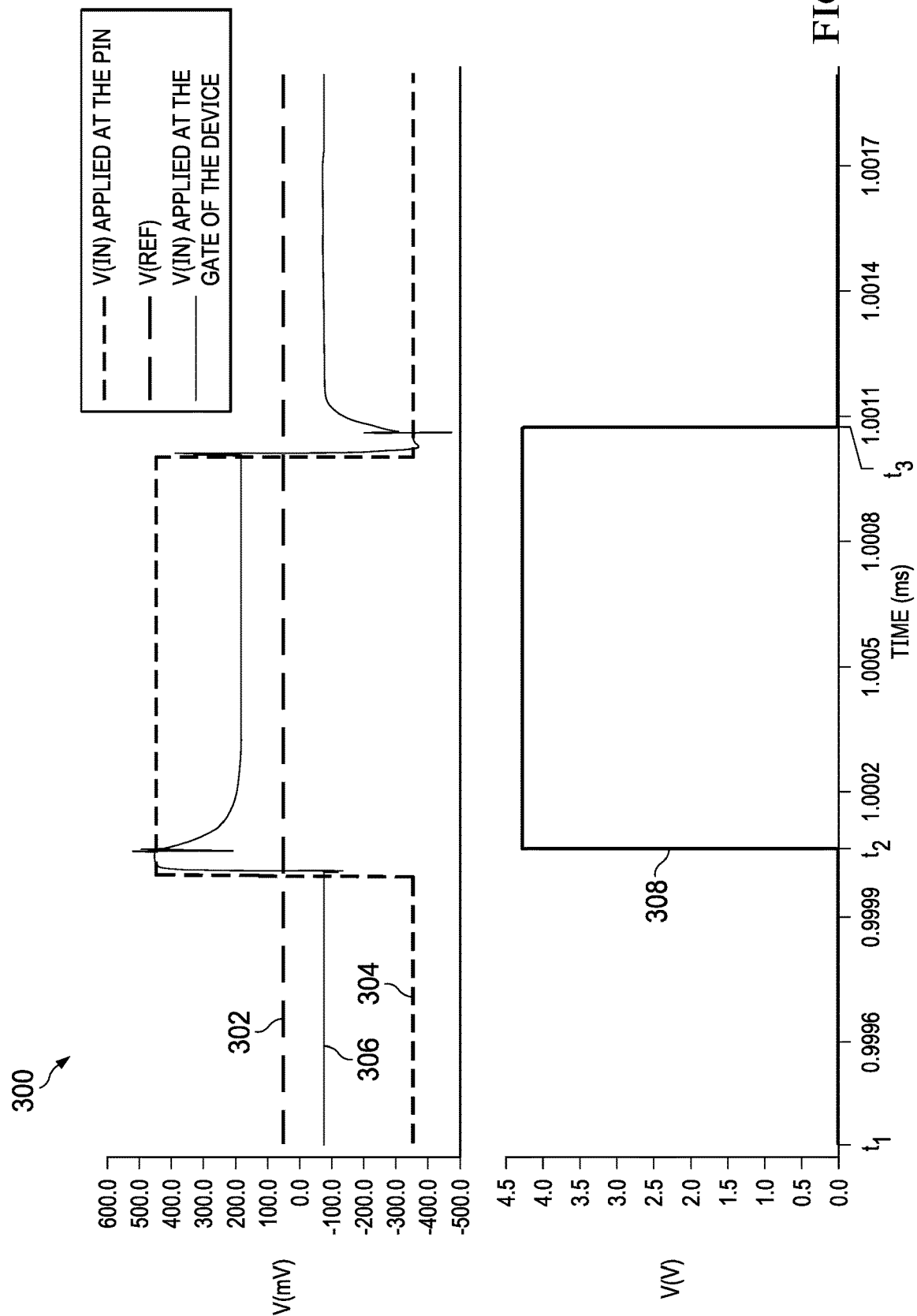

NBTI PROTECTION FOR DIFFERENTIAL PAIRS

BACKGROUND

Some circuits or devices have differential input stages that include a pair of transistors. These input stages appear in comparators, amplifiers, and other devices. Each of the inputs is coupled to a gate of a transistor. Each input stage transistor may be a metal-oxide-silicon field effect transistor ("MOSFET") (such as an n-channel MOSFET (NFET or NMOS), or a p-channel MOSFET, (PFET or PMOS)) in some examples.

SUMMARY

In accordance with examples of the description, a system includes a differential input device having a first input and a second input. The system also includes a window generator configured to output, at a first output, a first voltage above a reference voltage and a second voltage, at a second output, below the reference voltage. The system includes a multiplexer coupled to the first output and the second output, the multiplexer configured to receive the first voltage, the second voltage, and an input voltage. The system also includes a selector coupled to the multiplexer and configured to select the first voltage, the second voltage, or the input voltage based on a value of the input voltage, where the selector is configured to cause the multiplexer to provide the selected voltage to the first input of the differential input device, where a voltage source provides the reference voltage to the second input of the differential input device.

In accordance with examples of the description, a system includes a multiplexer having a first input, a second input, and a third input. The system also includes a first buffer having an input coupled to a first voltage source and an output coupled to the first input of the multiplexer. The system includes a second buffer having an input coupled to a second voltage source and an output coupled to the second input of the multiplexer. The system also includes a first system input coupled to the third input of the multiplexer. The system includes a window comparator including an output coupled to the multiplexer. The system also includes a differential input device having a first transistor coupled to an output of the multiplexer and a second transistor coupled to a second system input.

In accordance with examples of the description, a method includes providing an input voltage and a reference voltage to a window comparator. The method also includes creating a first voltage above the reference voltage and a second voltage below the reference voltage. The method includes providing the input voltage, the first voltage, and the second voltage to a multiplexer. The method also includes selecting the first voltage, the second voltage, or the input voltage based on a value of the input voltage. The method includes providing the selected voltage to a first input of a differential input device. The method also includes providing the reference voltage to a second input of the differential input device.

BRIEF DESCRIPTION OF THE DRAWINGS

FIG. 3 is a graph of voltage versus time in accordance with various examples.

The same reference numbers or other reference designators are used in the drawings to designate the same or similar (functionally and/or structurally) features.

DETAILED DESCRIPTION

Figure 1:
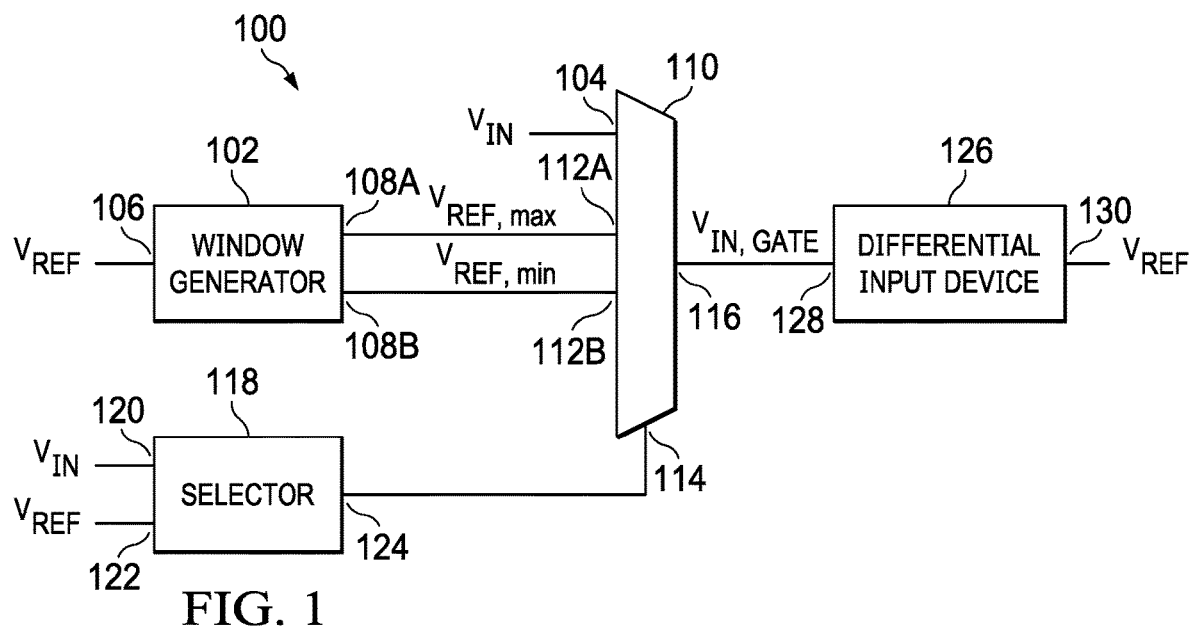
FIG. 1 is a block diagram of a negative bias temperature instability (NBTI) protection scheme in accordance with various examples.

A device such as a comparator or an amplifier may have differential input stages, where a transistor is coupled to each input. Over the lifetime of the device, negative bias temperature instability (NBTI) or positive bias temperature instability (PBTI) may occur in the transistors, which can cause the threshold voltages of the transistors to drift. NBTI is caused by positive charges becoming trapped at the oxide-semiconductor boundary underneath the gate of a MOSFET. These positive charges partially cancel the negative gate voltage without contributing to conduction through the channel as electron holes in the semiconductor. After the gate voltage is removed, the trapped charges dissipate over a time period of milliseconds to hours. Different transistors may experience different amounts of NBTI, such as with differential input transistors that have different voltages applied to them over time.

NBTI may cause an increase in the threshold voltage and decrease in the drain current and transconductance of a MOSFET. The degradation often occurs in PFETs, because they often operate with negative gate-to-source voltages. However, the same mechanism may also affect NFETs when biased with a negative bias applied to the gate. NBTI and PBTI may cause the threshold voltages of the input transistors to shift from their initial values. With differential input transistors, the threshold voltage of one transistor may shift over time more than the threshold voltage of the other transistor. Therefore, due to this uneven shift in the threshold voltages, the performance of the device varies over time. For example, if a transistor is stressed by a voltage of a few volts at a high temperature over a period of years, a difference of a few millivolts in the threshold voltage may result.

Using circuitry of some example embodiments, the differential input voltage applied to the transistors of the input stage is limited. The value of the input voltage at a first input is windowed (e.g., restricted between a maximum value and a minimum value) so that it stays within a certain range around the value of the input voltage at the second input. Therefore, the difference between the two input voltages remains below a predetermined amount. In examples, a multiplexer (or other similar circuitry) and a window comparator (or other similar circuitry) are useful for limiting the differential input voltage. The window comparator compares the first input voltage to a maximum value and a minimum value. If the first input voltage is between the maximum value and the minimum value, the multiplexer provides the first input voltage to the first input of the differential input stage. If the first input voltage is above the maximum value, the multiplexer applies the maximum value to the first input of the differential input stage. If the first input voltage is below the minimum value, the multiplexer applies the minimum value to the first input of the differential input stage. Therefore, the voltage applied to the first input is always between the maximum value and the minimum value. By keeping the first input voltage within this predetermined window, the offset drift over time of the threshold voltage of the transistor coupled to the first input may be reduced.

FIG. 1 is a block diagram of an NBTI protection scheme in accordance with various examples herein. System 100 includes a window generator 102. Input 104, connected to multiplexer 110, provides an input voltage $V_{IN}$. Window generator 102 includes an input 106. Window generator 102 includes outputs 108A and 108B (collectively, outputs 108). The outputs 108 of window generator 102 are coupled to multiplexer 110. Multiplexer 110 includes inputs 112A and 112B, input 114, and output 116. In system 100, two connections are shown between window generator 102 and multiplexer 110, but more than two connections may be present in some examples.

System 100 also includes a selector 118. Selector 118 includes a first input 120 and a second input 122. Selector 118 includes an output 124 coupled to input 114 of multiplexer 110. System 100 also includes a differential input device 126 with a first input 128 and a second input 130 (e.g., system inputs). The first input 128 is coupled to output 116 of multiplexer 110. In some examples, differential input device 126 may be a comparator or an amplifier with a gate of a transistor (such as a PMOS device) coupled to each of first input 128 and second input 130.

In operation, a first voltage $V_{IN}$ (e.g., an input voltage) is applied to input 104 of multiplexer 110 and to first input 120 of selector 118. A second voltage $V_{REF}$ (e.g., a reference voltage) is applied to input 106 of window generator 102, to second input 122 of selector 118, and to second input 130 of differential input device 126. $V_{IN}$ and $V_{REF}$ may be provided by one or more voltage sources (not shown in FIG. 1), or may be inputs that are provided to system 100 in some examples.

System 100 creates two voltages that form a window (e.g., a maximum value and a minimum value) around the second voltage $V_{REF}$. One voltage has a magnitude greater than $V_{REF}$ by a predetermined offset voltage value, and is referred to herein as $V_{REF,MAX}$. The other voltage has a magnitude less than $V_{REF}$ by the predetermined offset voltage value, and is referred to herein as $V_{REF,MIN}$. Window generator 102 creates voltages $V_{REF,MAX}$ and $V_{REF,MIN}$ in examples. Window generator 102 provides two voltages to multiplexer 110 via outputs 108 in this example: $V_{REF,MAX}$ and $V_{REF,MIN}$.

In some approaches, $V_{IN}$ is applied to first input 128 and $V_{REF}$ is applied to second input 130 of differential input device 126. If there is a large differential voltage between $V_{IN}$ and $V_{REF}$, NBTI may cause the threshold voltages of the transistors within differential input device 126 to vary over time. However, in example embodiments herein, multiplexer 110 selects between $V_{IN}$, $V_{REF,MAX}$, and $V_{REF,MIN}$, and provides one of these voltages to differential input device 126 at first input 128. The voltage provided to first input 128 is referred to herein as $V_{IN,GATE}$, because it is provided to a gate of a transistor in differential input device 126. If $V_{IN}$ is between $V_{REF,MAX}$ and $V_{REF,MIN}$, multiplexer 110 provides $V_{IN}$ to differential input device 126. If the magnitude of $V_{IN}$ is greater than $V_{REF,MAX}$, $V_{REF,MAX}$ is provided to differential input device 126 by multiplexer 110. If the magnitude of $V_{IN}$ is less than $V_{REF,MIN}$, $V_{REF,MIN}$ is provided to differential input device 126 by multiplexer 110. Therefore, the voltage applied to first input 128 of differential input device 126 is between or equal to $V_{REF,MAX}$ and $V_{REF,MIN}$. $V_{REF,MAX}$ and $V_{REF,MIN}$ provide the boundaries of a "window" for the voltage applied to the first input 128. The boundaries of $V_{REF,MAX}$ and $V_{REF,MIN}$ keep the values of the voltages applied to first input 128 and second input 130 of differential input device 126 within a predetermined range of one another, which may reduce the effect of NBTI on the differential pair of transistors inside differential input device 126.

Selector 118 receives $V_{IN}$ at a first input 120 and $V_{REF}$ at a second input 122. Selector 118 determines whether $V_{IN}$ is greater than $V_{REF,MAX}$, less than $V_{REF,MIN}$, or between $V_{REF,MAX}$ and $V_{REF,MIN}$. Selector 118 is coupled to multiplexer 110, and instructs multiplexer 110 to select either $V_{IN}$, $V_{REF,MAX}$, or $V_{REF,MIN}$ from its inputs. If $V_{IN}$ is between $V_{REF,MAX}$ and $V_{REF,MIN}$, selector 118 instructs multiplexer 110 to select $V_{IN}$ and provides $V_{IN}$ to first input 128. If $V_{IN}$ is greater than $V_{REF,MAX}$, selector 118 instructs multiplexer 110 to select $V_{REF,MAX}$ and provides $V_{REF,MAX}$ to first input 128. If $V_{IN}$ is less than $V_{REF,MIN}$, selector 118 instructs multiplexer 110 to select $V_{REF,MIN}$ and provides $V_{REF,MIN}$ to first input 128. Therefore, selector 118 and multiplexer 110 operate to provide a voltage to first input 128 that is between or equal to $V_{REF,MAX}$ and $V_{REF,MIN}$. In examples, selector 118 is a window comparator as described below with respect to FIG. 2. Any suitable circuitry may be useful for implementing the functions of selector 118 in examples.

Figure 2:
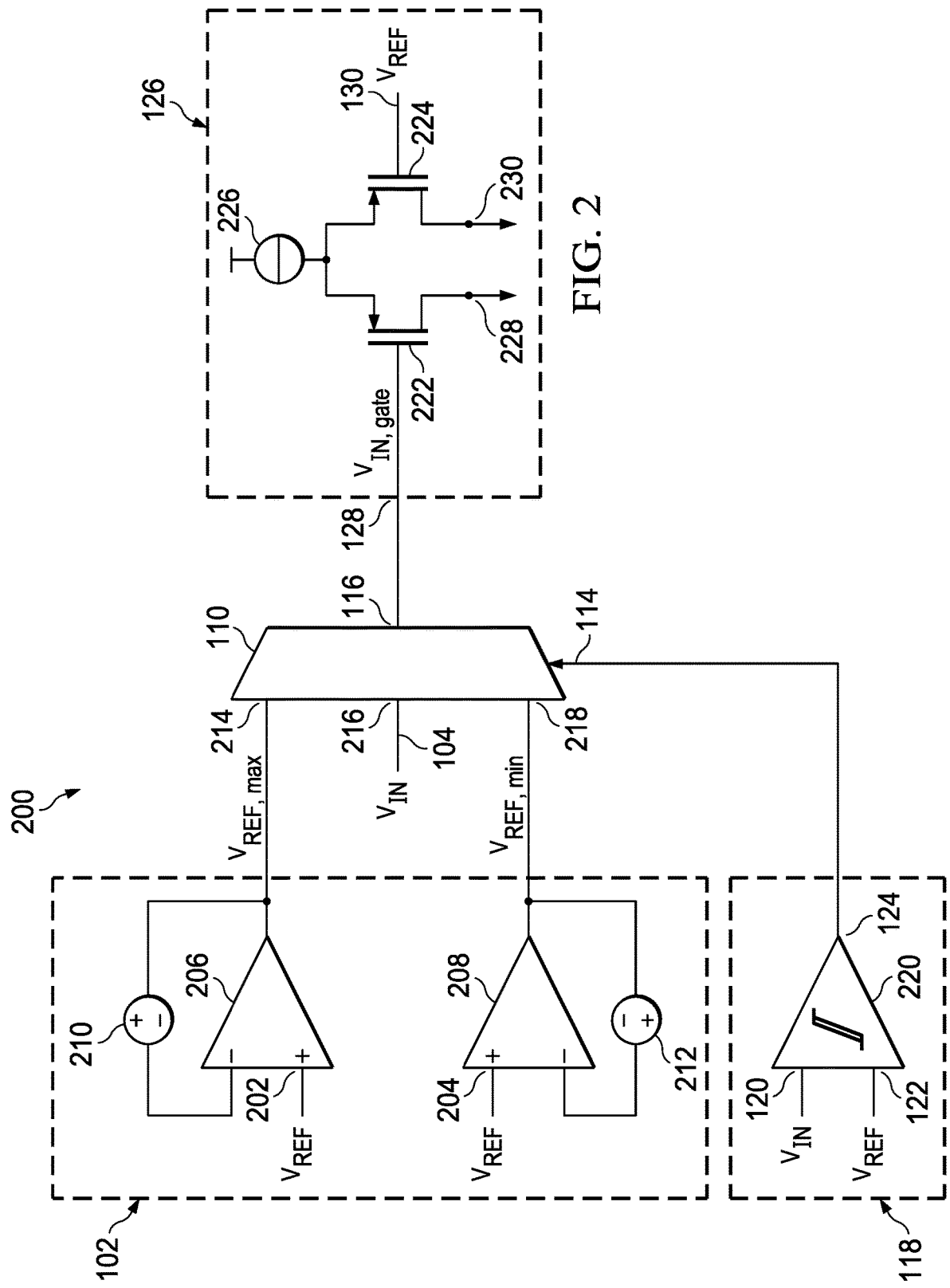
FIG. 2 is a schematic diagram of an NBTI protection scheme in accordance with various examples.

FIG. 2 is a schematic diagram of an NBTI protection scheme in accordance with various examples herein. System 200 is an example of an NBTI protection scheme that operates according to the example described above with respect to FIG. 1. System 200 includes a first input 104 that receives a voltage $V_{IN}$. System 200 also includes second input 202 and third input 204, which each receive a voltage $V_{REF}$. System 200 includes buffer 206, buffer 208, voltage offset 210 (e.g., a voltage source), and voltage offset 212 (e.g., a voltage source). Components 206, 208, 210, and 212 make up the window generator 102 in some examples. Buffers 206, 208, and voltage offsets 210, 212 are just one example implementation for generating a window. Any suitable circuitry for generating a window may be useful in other examples. Multiplexer 110 includes inputs 214, 216, and 218.

System 200 also includes window comparator 220, which is an example of selector 118 shown in FIG. 1. Window comparator 220 includes a first input 120, second input 122, and output 124. System 200 includes an example differential input device 126 (in other examples, differential input device 126 may be any device, such as single-stage or multi-stage amplifiers and/or comparators, that includes differential inputs where one input is applied to the gate of one MOSFET while the other input is applied to the gate of another MOSFET). Differential input device 126 includes a first input 128 and a second input 130. A simplified example of a differential input device 126 is shown in system 200. Differential input device 126 includes transistor 222, transistor 224, and current source 226. In this example, transistors 222 and 224 are PFET devices. Transistors 222 and 224 are part of the input stage of differential input device 126. A first voltage $V_{IN}$ is applied to the first input 128 of differential input device 126, which is coupled to the gate of transistor 222. A second voltage $V_{REF}$ is applied to the second input 130 of differential input device 126, which is coupled to the gate of transistor 224. Differential input device 126 also includes nodes 228 and 230, which may be output nodes of differential input device 126. Differential input device 126 may include other components not shown in FIG. 2. In an example, node 228 may be a first output node and node 230 may be a second output node. In another example, an output of differential input device 126 may be obtained from the difference between node 228 and node 230.

In system 200, buffers 206 and 208 produce $V_{REF,MAX}$ and $V_{REF,MIN}$, respectively. $V_{REF,MAX}$ and $V_{REF,MIN}$ provide the window that keeps the voltage applied to first input 128 within a predetermined range. Buffer 206 is coupled to voltage offset 210 to provide a voltage $V_{REF,MAX}$ to multiplexer 110. $V_{REF,MAX}$ is a voltage that is greater than $V_{REF}$ by a predetermined offset amount. Buffer 208 is coupled to voltage offset 212 to provide a voltage $V_{REF,MIN}$ to multiplexer 110. $V_{REF,MIN}$ is a voltage that is less than $V_{REF}$ by a predetermined offset amount. In some examples, the magnitude of the predetermined offset voltage provided by voltage offset 210 may be the same value as the magnitude of the predetermined offset voltage provided by voltage offset 212. $V_{REF,MAX}$ is provided to multiplexer 110 at input 214. $V_{REF,MIN}$ is provided to multiplexer 110 at input 218. $V_{IN}$ is provided to multiplexer 110 at input 216.

As described above with respect to FIG. 1, if $V_{IN}$ is between $V_{REF,MAX}$ and $V_{REF,MIN}$, multiplexer 110 provides $V_{IN}$ to differential input device 126. Window comparator 220 instructs multiplexer 110 to select input 216 and provide $V_{IN}$ to first input 128. If $V_{IN}$ is larger than $V_{REF,MAX}$, multiplexer 110 provides $V_{REF,MAX}$ to first input 128 via input 214, as instructed by window comparator 220. If $V_{IN}$ is less than $V_{REF,MIN}$, multiplexer 110 provides $V_{REF,MIN}$ to first input 128 via input 218, as instructed by window comparator 220. Therefore, window comparator 220 performs similar operations as selector 118 in FIG. 1.

The operation of system 200 provides a voltage to first input 128 that is between or equal to $V_{REF,MAX}$ and $V_{REF,MIN}$. If $V_{IN}$ is too high (e.g., above $V_{REF,MAX}$) or too low (e.g., below $V_{REF,MIN}$), the circuitry described in system 200 may protect transistors 222 and 224 from a large differential voltage.

System 200 is an example of an NBTI protection scheme as described herein. However, other variations may perform similar operations and fall within the scope of this disclosure. For example, $V_{REF,MAX}$ and $V_{REF,MIN}$ are produced with buffers 206, 208 and voltage offset 210, 212 as described above. Any other suitable technique or circuitry may be useful for creating $V_{REF,MAX}$ and $V_{REF,MIN}$. As another example, window comparator 220 and multiplexer 110 select the appropriate voltage to provide to first input 128. However, in other examples, any appropriate circuitry may be useful for determining which voltage to apply to first input 128 and to make that selection.

FIG. 3 is a graph 300 of voltages versus time in accordance with various examples herein. The top graph of graph 300, the y-axis represents voltage in millivolts (mV), while the x-axis represents time in milliseconds (ms). For the bottom graph of graph 300, the y-axis represents voltage in volts (V), while the x-axis represents time in milliseconds.

Waveform 302 is the voltage $V_{REF}$ applied to the second input 130 of differential input device 126 in examples. $V_{REF}$ is a flat input voltage in this example, with a value of about 50 mV. Waveform 304 is the voltage $V_{IN}$ applied to first input 104 in examples. $V_{IN}$ is the voltage applied to an input pin (e.g., a system input) of a device with a differential input. However, as described above, $V_{IN}$ may not be applied to the gate of transistor 222 if $V_{IN}$ is greater than $V_{REF,MAX}$ or less than $V_{REF,MIN}$. Instead, $V_{REF,MAX}$ or $V_{REF,MIN}$ are applied to the gate of transistor 222. Between time $t_1$ and $t_2$, $V_{IN}$ is approximately −350 mV. Between time $t_2$ and $t_3$, $V_{IN}$ is approximately 450 mV. After time $t_3$, $V_{IN}$ is again approximately −350 mV.

Waveform 306 represents the voltage applied at the gate of transistor 222, referred to herein as $V_{IN,GATE}$. $V_{IN,GATE}$ is equal to $V_{IN}$ if $V_{IN}$ is between $V_{REF,MAX}$ and $V_{REF,MIN}$. $V_{IN,GATE}$ is equal to $V_{REF,MAX}$ if $V_{IN}$ is greater than $V_{REF,MAX}$. $V_{IN,GATE}$ is equal to $V_{REF,MIN}$ if $V_{IN}$ is less than $V_{REF,MIN}$. In this example, between time $t_1$ and $t_2$, $V_{IN}$ (waveform 304) is below $V_{REF,MIN}$, so $V_{IN,GATE}$ (waveform 306) is equal to $V_{REF,MIN}$, which is approximately −90 mV in this example. If $V_{IN}$ were applied to the gate of transistor 222, the differential voltage between $V_{IN}$ and $V_{REF}$ would be approximately 400 mV between time $t_1$ and $t_2$. However, in this example, the voltage $V_{REF,MIN}$ (e.g. $V_{IN,GATE}$ is equal to $V_{REF,MIN}$) is applied to the gate of transistor 222 between time $t_1$ and $t_2$. Therefore, the differential voltage between $V_{IN,GATE}$ and $V_{REF}$ is approximately 140 mV (e.g., 50 mV minus −90 mV). The differential input voltage is reduced from 400 mV to 140 mV in accordance with examples herein.

Between time $t_2$ and $t_3$, $V_{IN}$ (waveform 304) is approximately 450 mV. However, $V_{IN,GATE}$ between time $t_2$ and $t_3$ is restricted to $V_{REF,MAX}$, which is approximately 190 mV in this example. Therefore, the differential input voltage between time $t_2$ and $t_3$ is reduced from 400 mV to 140 mV in accordance with this example. During the period from time $t_2$ and $t_3$, the gate voltage, $V_{IN,GATE}$ is equal to $V_{REF,MAX}$.

As shown in FIG. 3, the examples herein may limit the differential input voltage between $V_{REF}$ and $V_{IN,GATE}$, even if $V_{IN}$ is much higher or much lower than $V_{REF}$. Waveform 306 shows that some transients may occur when $V_{IN}$ switches from high to low or vice versa, but $V_{IN,GATE}$ settles to the windowed values (e.g., $V_{REF,MAX}$ and $V_{REF,MIN}$). Waveform 308 shows an output voltage of the differential input device 126. The output voltage may be a voltage at node 228, a voltage at node 230, or a voltage difference between node 228 and node 230. The output voltage is approximately 0 V between $t_1$ and $t_2$, and approximately 4.3 V between time $t_2$ and $t_3$ in this example. Based on waveform 308, the performance/output of differential input device 126 is not degraded by the use of $V_{IN,GATE}$ instead of $V_{IN}$.

Figure 4:
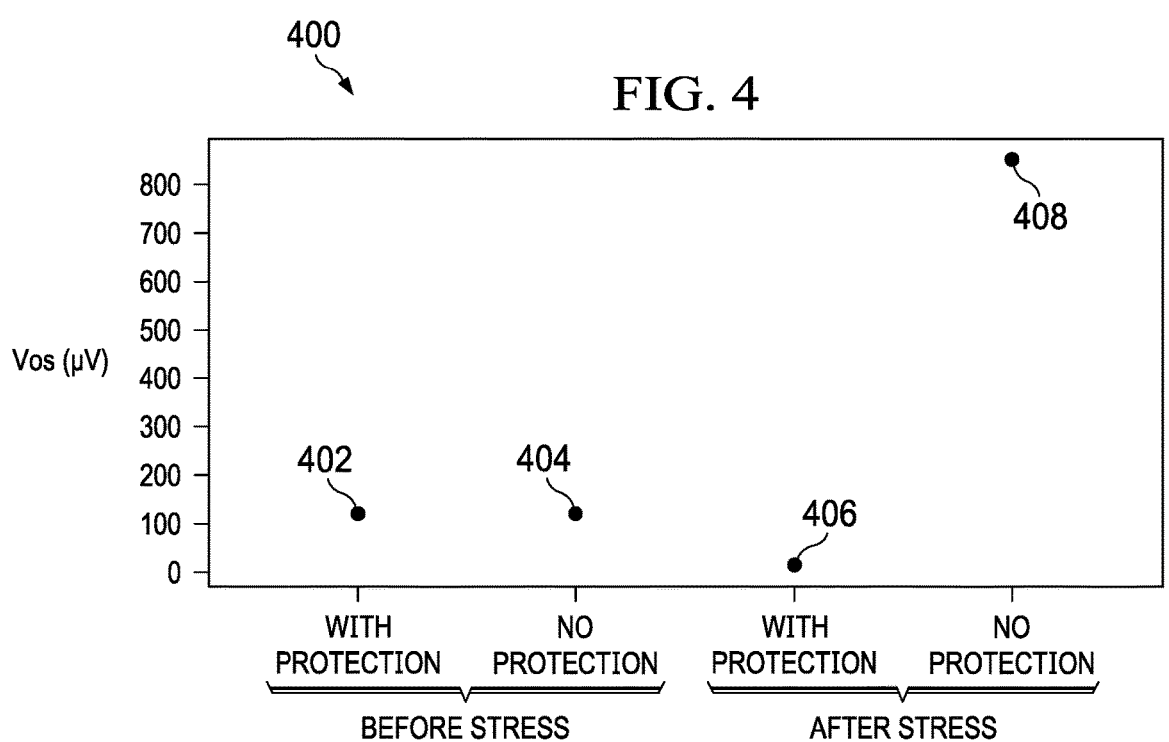
FIG. 4 is a graph of voltage offsets between inputs of a differential input device in accordance with various examples.

FIG. 4 is a graph 400 of voltage offsets between inputs of a differential input device in accordance with various examples herein. The x-axis represents the voltage offset $V_{OS}$ in microvolts, while the y-axis represents the NBTI protection status. Points 402 and 404 represent voltage offsets $V_{OS}$ with no voltage applied to the input of a differential input device. Points 406 and 408 represent voltage offsets $V_{OS}$ with a voltage applied to the input of the differential input device 126. In this example, $V_{IN}$ is 3 V and $V_{REF}$ is 0 V. The condition for the stress was operating the device at 150 degrees Celsius for 168 hours.

In graph 400, point 402 represents a voltage offset $V_{OS}$ between inputs of a differential input device with NBTI protection as described herein. The voltage offset $V_{OS}$ at point 402 is approximately 120 microvolts. Point 404 represents a voltage offset $V_{OS}$ between inputs of a differential input device with no NBTI protection as described herein. The voltage offset $V_{OS}$ at point 404 is approximately 120 microvolts. With no voltage applied, these voltage offsets $V_{OS}$ are approximately equal. This voltage offset may be due to the inherent difference between the two transistors of differential input device 126 due to process variations when fabricating these two devices.

In graph 400, point 406 represents a voltage offset $V_{OS}$ between inputs of a differential input device with NBTI protection as described herein, with a voltage differential of approximately 3 V between the inputs. The voltage offset $V_{OS}$ at point 406 is approximately 20 microvolts. Point 408 represents a voltage offset $V_{OS}$ between inputs of a differential input device with no NBTI protection as described herein, and with a voltage differential of approximately 3 V between the inputs. The voltage offset $V_{OS}$ at point 408 is over 800 microvolts.

Graph 400 shows that when there is no NBTI protection as described herein, the voltage offset $V_{OS}$ is much higher (point 408) than the voltage offset $V_{OS}$ when NBTI protection is applied (point 406). Therefore, the examples described herein may reduce the voltage offset $V_{OS}$ between the inputs of a differential input device.

Figure 5:
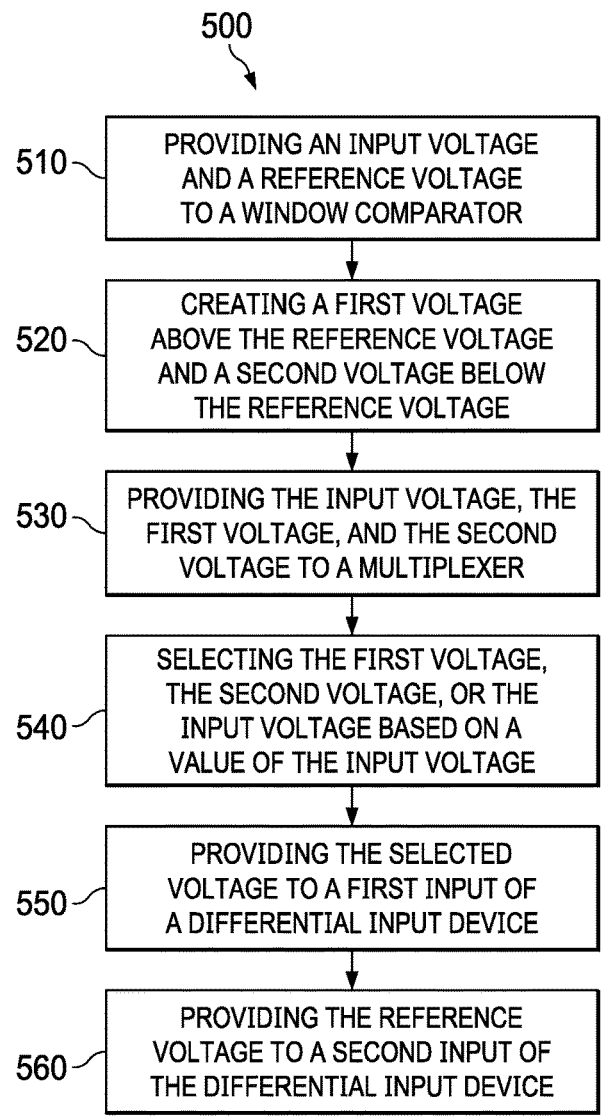
FIG. 5 is a flow diagram of a method for NBTI protection in accordance with various examples.

FIG. 5 is a flow diagram of a method 500 for NBTI protection in accordance with various examples herein. The steps of method 500 may be performed in any suitable order. The hardware components described above with respect to FIGS. 1-2 may perform method 500 in some examples.

Method 500 begins at 510, where an input voltage and a reference voltage are provided to a window comparator. The input voltage may be a voltage such as $V_{IN}$, and the reference voltage may be a voltage such as $V_{REF}$ as described herein. The window comparator may be window comparator 220 in examples.

Method 500 continues at 520, where a window generator (e.g., window generator 102) creates a first voltage above the reference voltage and a second voltage below the reference voltage. Any suitable circuitry may be used to create the first voltage and the second voltage. In examples herein, buffers and voltage offsets are useful to create the first voltage and the second voltage, as described above with respect to FIG. 2.

Method 500 continues at 530, where the input voltage, the first voltage, and the second voltage are provided to a multiplexer. At 540, the multiplexer selects the first voltage, the second voltage, or the input voltage based on a value of the input voltage. As described above, if the input voltage is between the first voltage and the second voltage, the multiplexer selects the input voltage. If the input voltage is above the first voltage, the multiplexer selects the first voltage. If the input voltage is below the second voltage, the multiplexer selects the second voltage.

Method 500 continues at 550, where the multiplexer provides the selected voltage to a first input of a differential input device. The selected voltage may be provided to a gate of a transistor in an input stage of the differential input device, such as differential input device 126.

Method 500 continues at 560, where the reference voltage is provided to a second input of the differential input device. As described above, the differential input device may be a comparator or an amplifier, and may perform an operation on the voltages provided at its inputs.

Figure 6:
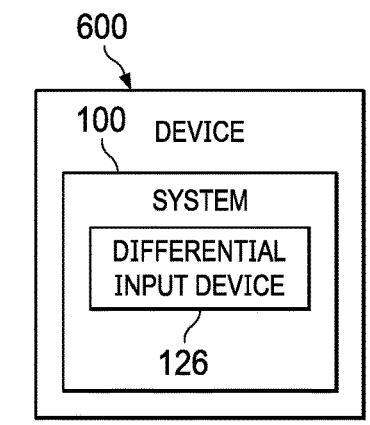
FIG. 6 is a block diagram of a device with an NBTI protection scheme in accordance with various examples.

FIG. 6 is a block diagram of a device 600 with an NBTI protection scheme in accordance with various examples. Device 600 is one example of an application for the NBTI protection scheme described herein. Device 600 includes system 100, as described above with respect to FIG. 1. System 100 includes a differential input device 126 as described above. Device 600 may include other circuitry or components not shown in FIG. 6.

Device 600 may be any singulated semiconductor substrate (e.g. a semiconductor chip), printed circuit board (PCB), package, or electronic device with a differential input. For example, device 600 may be an amplifier, a comparator, an analog-to-digital converter, a buffer, a driver, or any other system that includes a differential input. System 100 operates as described above to reduce the offset drift over time of the threshold voltage of the transistor coupled to an input.

In examples herein, devices such as device 600 with a differential input may exhibit better precision in terms of offset voltage and offset voltage drift over time, due to reduced effects of NBTI and PBTI. The performance of the device may be made more stable and robust over the lifetime of the device.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component. While the use of particular transistors are described herein, other transistors (or equivalent devices) may be used instead with little or no change to the remaining circuitry. For example, a MOSFET (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). While, in some examples, certain elements may be included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means+/−10 percent of the stated value. Modifications are possible in the described examples, and other examples are possible within the scope of the claims.

What is claimed is:

1. A system having a system input configured to receive an input voltage, comprising:
    a first p-channel transistor having a first gate;
    a second p-channel transistor having a second gate adapted to be coupled to a reference voltage;
    a window generator having a window generator input coupled to the system input and having a window generator output coupled to the first gate, the window generator operable to output at the window generator output a first voltage if the input voltage is greater than a first threshold voltage and operable to output at the window generator output a second voltage if the input voltage is less than a second threshold voltage; and
    wherein the first voltage is less than or equal to the first threshold voltage and the second voltage is greater than or equal to the second threshold voltage.

2. The system of claim 1, wherein the first voltage is greater than the second threshold voltage.

3. The system of claim 1, wherein the second voltage is less than the first threshold voltage.

4. The system of claim 1, wherein the first p-channel transistor is a p-channel metal-oxide-silicon field effect transistor.

5. The system of claim 1, wherein the second p-channel transistor is a p-channel metal-oxide-silicon field effect transistor.

6. The system of claim 1, wherein the system is operable to lessen the effects of negative bias temperature instability.

7. A system having a system input configured to receive an input voltage, comprising:
    a differential input device having a p-channel transistor, the p-channel transistor having a gate;
    a window generator having a window generator input coupled to the system input and having a window generator output coupled to the gate, the window generator operable to output at the window generator output a first voltage if the input voltage is greater than a first threshold voltage and operable to output at the window generator output a second voltage if the input voltage is less than a second threshold voltage; and
    wherein the first voltage is less than or equal to the first threshold voltage and the second voltage is greater than or equal to the second threshold voltage.

8. The system of claim 7, wherein the first voltage is greater than the second threshold voltage.

9. The system of claim 7, wherein the second voltage is less than the first threshold voltage.

10. The system of claim 7, wherein the p-channel transistor is a p-channel metal-oxide-silicon field effect transistor.

11. The system of claim 7, wherein the system is operable to lessen the effects of negative bias temperature instability.

12. A system having a system input configured to receive an input voltage, comprising:
    a comparator having a p-channel transistor, the p-channel transistor having a gate;
    a window generator having a window generator input coupled to the system input and having a window generator output coupled to the gate, the window generator operable to output at the window generator output a first voltage if the input voltage is greater than a first threshold voltage and operable to output at the window generator output a second voltage if the input voltage is less than a second threshold voltage; and
    wherein the first voltage is less than or equal to the first threshold voltage and the second voltage is greater than or equal to the second threshold voltage.

13. The system of claim 12, wherein the first voltage is greater than the second threshold voltage.

14. The system of claim 12, wherein the second voltage is less than the first threshold voltage.

15. The system of claim 12, wherein the p-channel transistor is a p-channel metal-oxide-silicon field effect transistor.

16. The system of claim 12, wherein the system is operable to lessen the effects of negative bias temperature instability.

17. The system of claim 12, wherein the system is an analog-to-digital converter.

* * * * *